DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED JULY 25, 1972

900 O.G. 1234

T900,031

NOVEL PYRYLIUM SALTS AND USES THEREFOR

Constantine C. Petropoulos and Joseph A. Arcesi, both of Kodak Park, Rochester, N.Y. 14650

Filed Nov. 1, 1971, Ser. No. 194,487
**Int. Cl. G03g *5/06***
U.S. Cl. 96—1.5
No Drawing. 25 Pages Specification

Vinyl substituted pyrylium salts are useful as sensitizers in electrophotographic systems and in photopolymerizable systems as either sensitizers, initiators or photopolymerizable monomers. The salts can be represented by the formula:

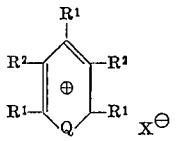

wherein at least one of the $R^1$ groups is an acrylic group appended to the pyrylium nucleus through a linking group, said $R^1$ group preferably having the structure:

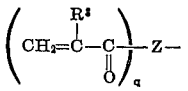

wherein $q$ is 1 or 2, $R^3$ is hydrogen or a methyl group and —Z— is a divalent or trivalent linking group selected from

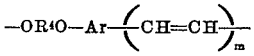

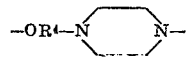

and

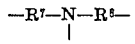

wherein each $R^7$ and $R^8$ independently has the structure:

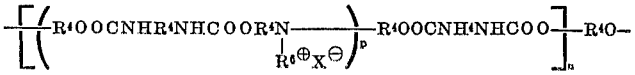

wherein the linking group is attached to the

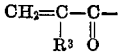

group through its terminal oxygen atom and to the pyrylium nucleus at the other end; $m$ and $n$ are each 0 or 1; $p$ is 0 to 4; $R^4$ is an alkylene group having 2 to 10 carbon atoms; $R^6$ is a 2- or 4-pyrylium or thiapyrylium nucleus; Ar is an arylene group; the remaining $R^1$ groups are hydrogen, alkyl or aryl, preferably aryl, or are taken together with an adjacent $R^2$ group to represent the atoms necessary to complete a fused aromatic ring system; each $R^2$ is a hydrogen atom or is taken together with an adjacent $R^1$ to form a fused aromatic ring system; Q is —S— or —O—; and $X^{\ominus}$ is an anion. Representative pyrylium salts useful in this invention and having the above structure include:

2,6-diphenyl-4-[(4,2-methacryloyloxyethoxy)phenyl] pyrylium perchlorate.

2,6-diphenyl-4-[4-(2-methacryloyloxyethoxy)phenyl] pyrylium perchlorate.

2,6-diphenyl-4-(4-methacrylamidophenyl)thiapyrylium perchlorate.

4-[4-(2-methacryloyloxyethoxy)styryl]flavylium perchlorate.

2,6-diphenyl-4-[4-(2-methacryloyloxyethoxy)phenyl] thiapyrylium perchlorate.

2,6-diphenyl-4-[4-(2-methacryloyloxyethyl)piperazinyl] pyrylium perchlorate.

4-[N,N-bis(2-methacryloyloxyethyl)amino]-2,6-diphenyl pyrylium perchlorate.

4-[N,N-bis(5,12-diaza - 19 - methylene - 3,14,17 - trioxa-4,13,18-trioxoeicosyl)amino]-2,6-diphenylpyrylium perchlorate.

4,4′ - [21,38 - (2,57-dimethylene-9,16,21,25,33,38,43,50-octaaza-4,17,18,24,35,41,52,55-octaoxa-3,8,17,26,34,42,51,56-octaoxooctapentacontylene)]bis(2,6-diphenylpyrylium perchlorate).